(12) United States Patent
Ferguson et al.

(10) Patent No.: US 12,222,371 B2
(45) Date of Patent: Feb. 11, 2025

(54) RESIDUAL CURRENT MONITORING TYPE B WITH INTEGRATED SELF-TEST SYSTEM AND METHOD

(71) Applicant: VERTIV CORPORATION, Columbus, OH (US)

(72) Inventors: Kevin R. Ferguson, Dublin, OH (US); Jason Armstrong, Lincoln, NE (US)

(73) Assignee: Vertiv Corporation, Westerville, OH (US)

(*) Notice: Subject to any disclaimer, the term of this patent is extended or adjusted under 35 U.S.C. 154(b) by 183 days.

(21) Appl. No.: 18/079,098

(22) Filed: Dec. 12, 2022

(65) Prior Publication Data

US 2023/0184812 A1    Jun. 15, 2023

Related U.S. Application Data

(60) Provisional application No. 63/288,158, filed on Dec. 10, 2021.

(51) Int. Cl.
*G01R 35/00* (2006.01)
*G01R 15/18* (2006.01)
*G01R 19/00* (2006.01)

(52) U.S. Cl.
CPC ......... *G01R 15/18* (2013.01); *G01R 19/0038* (2013.01); *G01R 35/00* (2013.01)

(58) Field of Classification Search
CPC .. G01R 15/18; G01R 15/185; G01R 19/0038; G01R 19/2513; G01R 35/00; G01R 31/52
See application file for complete search history.

(56) References Cited

U.S. PATENT DOCUMENTS

2013/0120094 A1*  5/2013  Goinga ............... H01F 38/38
                                                    336/174
2014/0139956 A1   5/2014  Ward
2014/0312877 A1  10/2014  Kammer
(Continued)

FOREIGN PATENT DOCUMENTS

| EP | 2846432 B1 | 4/2016 |
| EP | 3121921 A1 | 1/2017 |
| JP | 2019002767 A * | 1/2019 |

OTHER PUBLICATIONS

PCT International Search Report dated Apr. 27, 2023; PCT International Application No. PCT/US2022/052547.

*Primary Examiner* — Lee E Rodak
*Assistant Examiner* — Demetrius R Pretlow
(74) *Attorney, Agent, or Firm* — Suiter Swantz IP

(57) ABSTRACT

The present disclosure is a system and method for measuring AC residual current and DC residual current using a singular type-B residual current monitoring device. The system includes a sensor comprising two or more cores that measure residual AC current and residual DC current from two or more current carrying conductors through the cores that carry AC current and DC current. The system includes a controller that sends both an AC excitation current to the cores, as well as a DC nulling current that cancels out the DC residual current, allowing the system to then accurately measure the AC residual current. The system also includes a self-test feature that injects known quantities of both AC current and DC current through the sensor to determine if the sensor is functioning properly.

19 Claims, 10 Drawing Sheets

(56) References Cited

U.S. PATENT DOCUMENTS

| | | | |
|---|---|---|---|
| 2015/0331015 A1* | 11/2015 | Lee | G01R 15/20 |
| | | | 324/117 R |
| 2015/0355273 A1 | 12/2015 | Adlhoch et al. | |
| 2018/0299499 A1* | 10/2018 | Seidler | H02H 3/335 |
| 2023/0021222 A1* | 1/2023 | Kudimow | G01R 19/0092 |

* cited by examiner

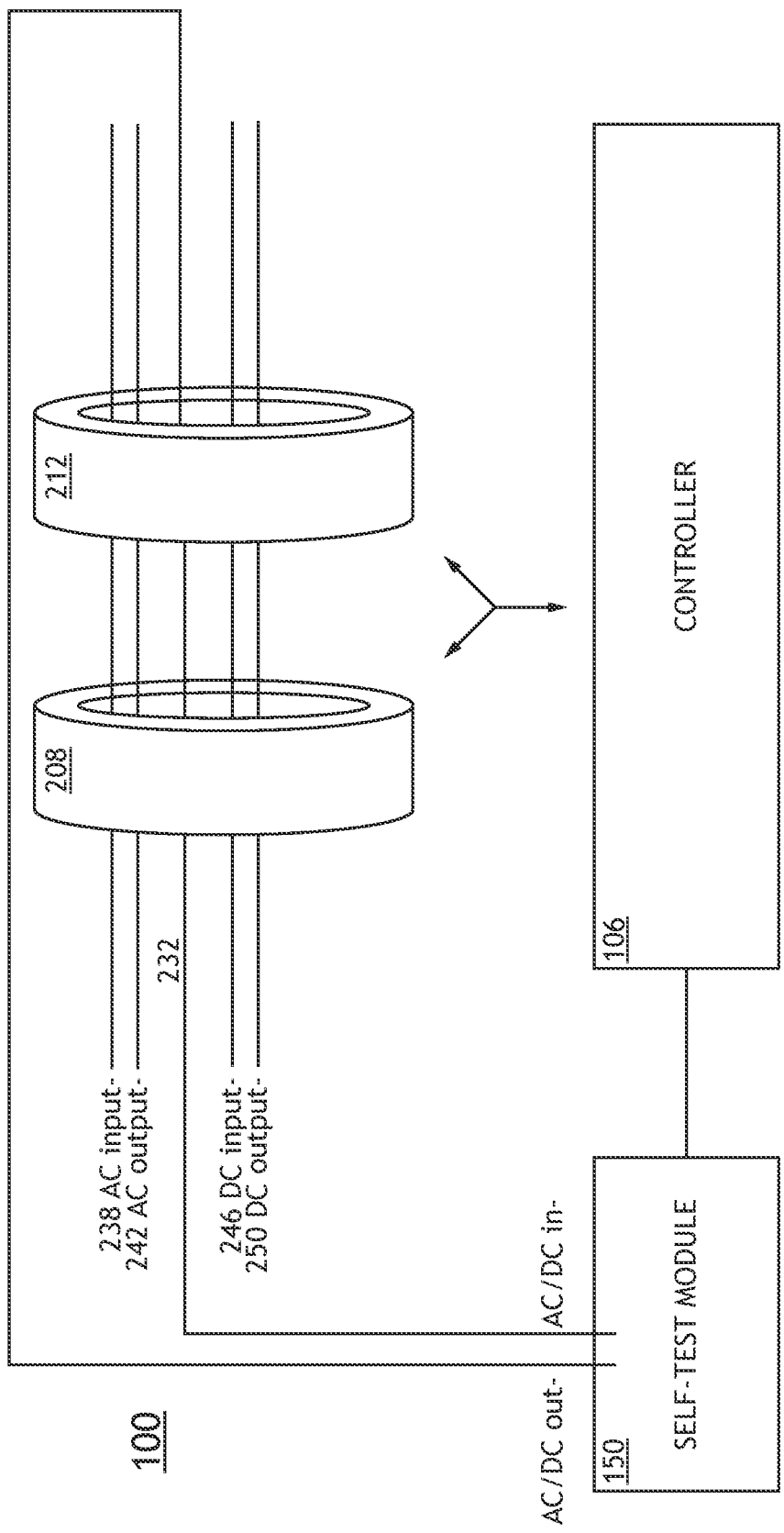

RESIDUAL CURRENT MONITORING TYPE B WITH INTEGRATED SELF-TEST SYSTEM AND METHOD

PRIORITY

This application claims priority to U.S. Provisional Application No. 63/288,158 filed Dec. 10, 2021, which is incorporated by reference herein in its entirety. Any and all applications for which a foreign or domestic priority claim is identified in the Application Data Sheet as filed with the present application are hereby incorporated by reference under 37 CFR 1.57.

TECHNICAL FIELD

The present disclosure relates generally to measurements of electrical currents, and more particularly to measurements of both AC residual currents and DC residual currents within a single electronic device or form factor.

BACKGROUND

Proper function of power distribution units (PDUs) requires competent control of current leakage. For example, a PDU may power systems with failing electrical insulation of components, allowing residual current to ground instead of flowing through a return conductor of the input power supply cord. In another example, the internal components of the PDU may fail, leading to increased residual current. The amount of residual current may worsen over time, such as through exposure to harsh environmental conditions, leading to cracking of insulation. If not detected and corrected, increases in residual current may lead to safety concerns such as fire and electrocution.

Residual current monitors (RCMs) detect residual current, such as AC current or pulsed DC current, through the sensing of the current of a conductor as it passes through, and connects to, a load, and then returns through a wire coil. In a leakage free or fault-free system, the sum of the current detected by the wire coil is equal to zero (e.g., no voltage is induced). However, upon a fault, the sum of the current detected by the wire coil is non-zero, which the residual current monitor reports.

In mixed AC and DC environments, RCMs, particularly RCMs configured with type A transformers, are compromised by excessive DC current, and do not effectively measure flat DC current. Furthermore, run-time safety testing of RCM components to ensure that both AC residual current monitoring and DC residual current monitoring are functioning correctly is also difficult. For example, some RCMs that can measure both AC and DC residual currents are only configured to self-test using injected AC current.

Accordingly, it may be advantageous for a system and method to remedy the shortcomings of the conventional approaches identified above.

SUMMARY

Accordingly, the present disclosure is directed to a system and method for measuring AC residual current and DC residual current using a singular type-B residual current monitoring device. The system includes a sensor comprising two or more cores that measure residual AC current and residual DC current from two or more current carrying conductors through the cores that carry AC current and DC current. The system includes a controller that sends both an AC excitation current to the cores, as well as a DC nulling current that cancels out the DC residual current, allowing the system to then accurately measure the AC residual current. The system also includes a self-test feature that injects known quantities of both AC current and DC current through the sensor to determine if the sensor is functioning properly.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 3 depicts a block diagram of a system for measuring AC residual current and DC residual current with multiple conductors inserted through the hole or aperture of a first core element and a second core element of the residual current sensor in accordance with an embodiment of the present disclosure;

DETAILED DESCRIPTION

Figure 1:
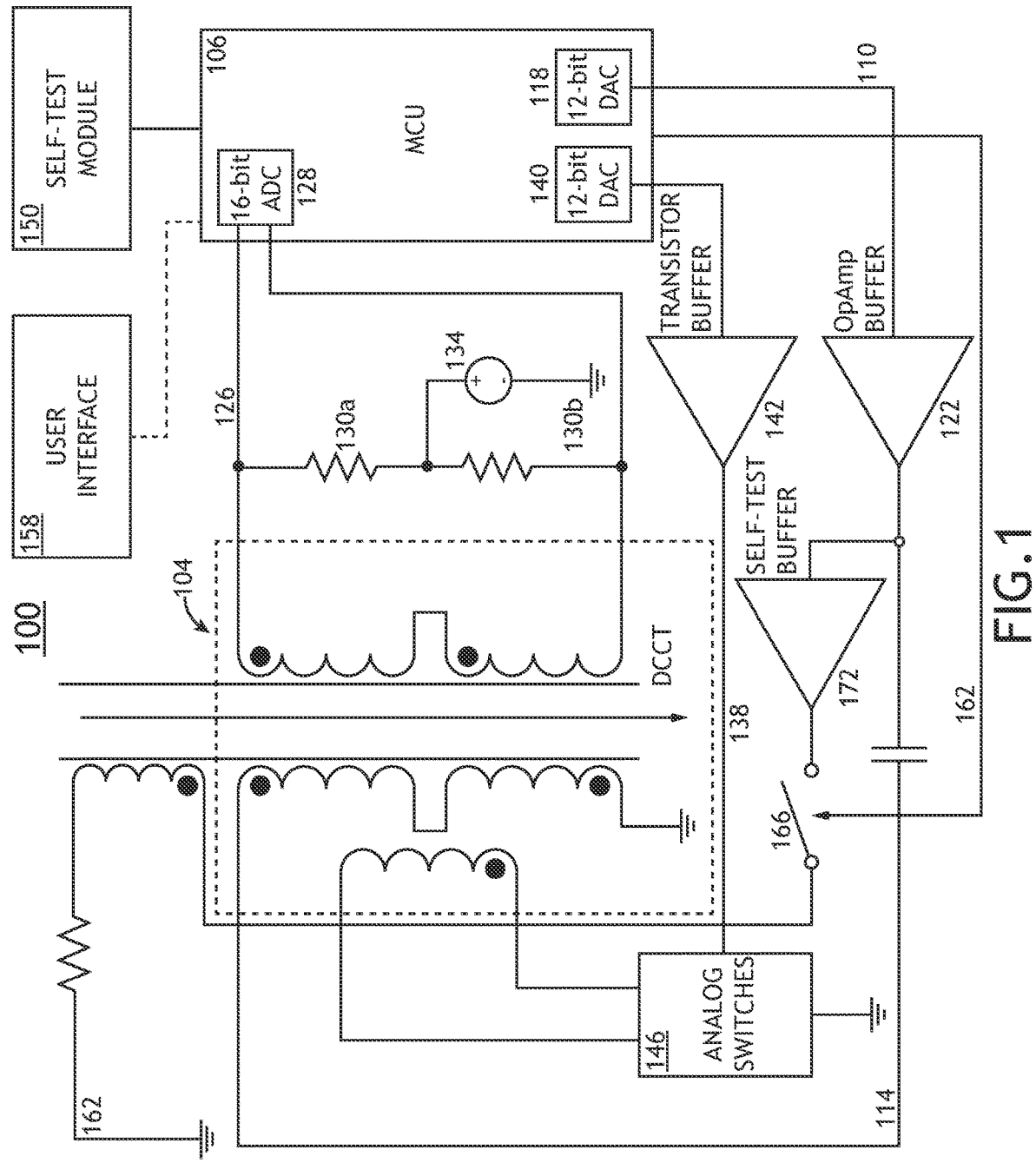
FIG. 1 depicts a diagram of a system for measuring AC residual current and DC residual current in accordance with an embodiment of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "embodiments" means that a particular element, feature, structure, or characteristic described in connection with the embodiment is included in at least one embodiment disclosed herein. The appearances of the phrase "in embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

In embodiments, as illustrated in FIG. 1, a system 100 for measuring AC residual current and DC residual current is presented. The system 100 includes a residual current sensor 104 that includes a wired coil set, detailed herein. The system 100 further includes a controller 106 configured to facilitate one or more functions of the system 100, and sensor circuitry 110 for transmitting signals between the controller 106 and the residual current sensor 104. Together, the sensor circuitry 110 and the residual current sensor 104 comprise a residual current sensor circuitry.

In embodiments, the sensor circuitry 110 includes an excitation path 114 configured to deliver an AC current to the residual current sensor 104. For example, the controller 106 may input a voltage from an AC excitation voltage source 118 onto the excitation path 114 that is transmitted to the residual current sensor 104. The voltage provided by the controller 106 may be any type of waveform. For example, the waveform may be configured as a sinusoidal waveform (loaded via a direct memory access (DMA). The AC excitation voltage source 118 may be configured as any AC generating source or AC modifying component including but not limited to a digital-to-analog converter (DAC) (e.g., 12-bit programmable DAC). The waveform loaded onto the excitation path 114 may include any characteristic waveform shape. For example, the waveform may be configured with a frequency of higher-order harmonic of line frequency (e.g., approximately 1.92 kHz). The AC excitation voltage source 118 may also be configured to adjust a phase of the voltage loaded onto the excitation path 114 to align to analog-to-digital converter (ADC) timing. In some embodiments, the excitation path 114 further includes an amplitude ramp-up control 122 configured to eliminate remanence at startup. For example, the amplitude ramp-up control 122 may be configured as a programmable digital-to-analog convertor driving its output signal through an Op-Amp buffer that may sufficiently drive the signals into the low impedance of DC current transformer (DCCT) coils.

In embodiments, the sensor circuitry 110 further includes a detection path 126 configured to deliver an electrical signal from the residual current sensor 104 to the controller 106, where the signal is processed via an analog-to-digital converter (ADC) 128 (e.g., a 16-bit ADC). The detection path 126 may further include one or more electrical components including one or more resistors 130 a-b and a local voltage source 134.

In embodiments, the sensor circuitry 110 further includes a DC nulling path 138 configured to deliver a DC nulling signal from the controller 106 to the residual current sensor 104. For example, the controller 106 may input a current from a DC nulling current source 140 onto the excitation path that is transmitted to the residual current sensor 104. The current inputted by the controller 106 may be any type of DC current. For example, the current may be configured as a DC signal (loaded via Direct Memory Access (DMA)) configured with a polarity opposite to that of a DC signal received by the controller 106 from the detection path 126. In another example, the current may be configured as a pulsed DC signal configured with a polarity opposite to that of a DC signal received by the controller 106 from the detection path 126. The DC nulling current source 140 may be configured as any DC generating source or any DC modifying component including but not limited to a DAC (e.g., a 12-bit programmable DAC). The DC nulling path 138 may further include a transistor buffer 142 (e.g., buffering up to 50 mA) and and/or a polarity switch 146 configured to invert the polarity of the DC nulling signal. For example, the DC nulling current source 140 may generate the current equivalent to the DC signal received by the controller 106 from the detection path 126, which is then switched in polarity by the polarity switch 146 to cancel the DC signal received by the controller 106.

In embodiments, the system 100 further includes a self-test module 150 electrically coupled to the controller 106. The self-test module 150 is configured to deliver both a test AC signal and a test DC signal (e.g., separately or combined) through the residual current sensor 104, causing a fluctuation in the flow of current in the detection path 126 which is detected and processed by the controller 106. The self-test module 150 may be physically coupled to and utilize components on the controller 106, or may be disposed adjacent to the controller. For example, the self-test module 150 may be included within the same form factor or housing as the controller 106. For instance, the self-test module 150 may share the same circuitry, processor, and/or circuit board as the controller 106. In another example, the self-test module 150 may be configured as a standalone module electrically coupled to the controller 106 with a processor and memory and instructed by the processor to transmit test AC voltages and test DC voltages. The self-test module 150 may be configured to send test AC signals and test DC signals at any time interval, upon any condition of the system 100 or device comprising the system 100 (e.g., conditions where faults are suspected but not confirmed by the system 100), and/or upon the direction of a user. For example, the self-test module 150 may be configured with a test schedule that is fixed. For instance, the self-test module 150 may be configured with a factory-set test interval (e.g., every 24 hours) that cannot be altered by a user. In particular, the self-test module 150 may include a procedure so that once a fault is detected at the factory-set interval, the user is alerted to the fault, and the self-test module 150 repeats the test every minute indefinitely until the self-test passes and the alarm is cleared, or the self-test permanently fails. Methods for performing a self-test are described herein.

In some embodiments, the system 100 includes a user interface 158 electrically coupled to the controller 106 and configured to facilitate the control of the system 100 by a user. The user interface 158 may include any input device for inputting data or instructions into the system 100 including but not limited to buttons, keyboards, or data ports configured to connect to other input devices. For example, the user interface 158 may include a data port allowing connectivity between the system 100 and a laptop. The system may also include any output device for outputting data including but not limited to a screen, or an indicator light. For example, the user interface 158 may be configured as an indicator light that indicates when a fault is detected. In another example, the user interface 158 may include a small display window configured to display information related to a detected fault.

In some embodiments, the system 100 includes a self-test path 162 communicatively coupled to the self-test module 150 and/or the controller 106. The self-test path 162 is configured to send a test AC current and a test DC current through the residual current sensor 104. The self-test path 162 may include one or more test switches 166 (e.g., an SPDT switch, or an analog switch that can be programmatically controlled). For example, the one or more test switches 166 may switch the self-test path 162 from carrying a self-test current, carrying no current, or carrying a voltage derived from the excitation path (e.g., via the self-test buffer 172).

Figure 2A:
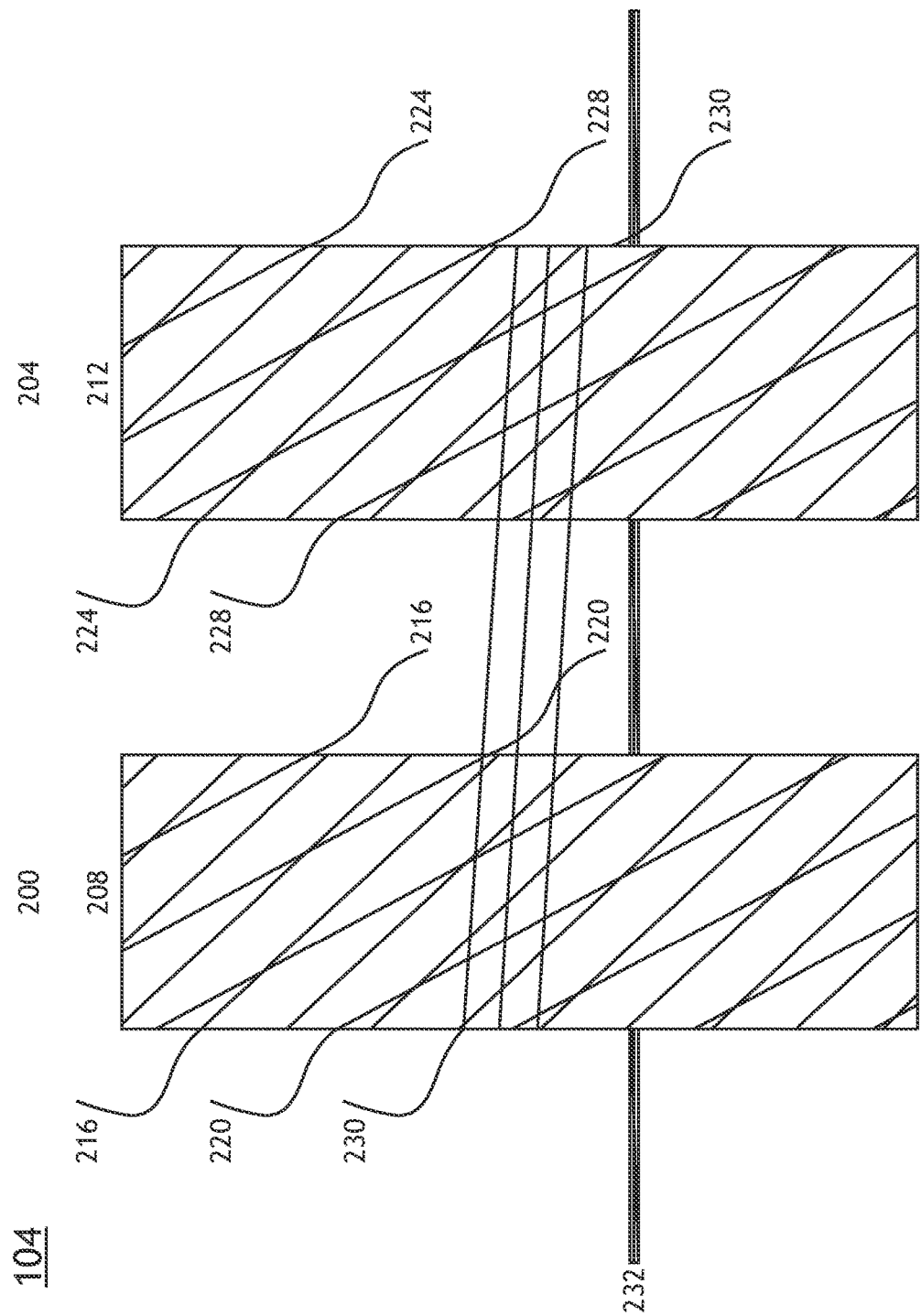
FIG. 2A depicts a diagram of a side-view of a residual current sensor in accordance with an embodiment of the present disclosure.

Referring to FIG. 2A, a diagram illustrating a side-view of the residual current sensor 104, in accordance with one or more embodiments of the disclosure, is shown. The residual current sensor 104 may include a set of cores containing any number of core elements and coil windings. For example, the residual current sensor may include a first core 200 and a second core 204. Each core may be configured with one or more core elements. For example, the first core 200 may include a first core element 208, and the second core 204 may include a second core element 212. Each core may also be configured with one or more coil windings. For example, the first core 200 may include a first excitation coil winding 216 and a first secondary coil winding 220. In another example, the second core 204 may include a second excitation coil winding 224 and a second secondary coil winding 228. The termini of each winding are labeled in FIG. 2A. The residual current sensor 104 further includes a DC null winding 230 that is shared by each wire coil (e.g., wound through both the first core element 208 and the second core element 212, as shown in FIG. 2A). The residual current sensor 104 may further include a self-test wire 232 (e.g., a portion of the self-test path 162 as shown in FIG. 1), passing through both the first core 200 and the second core 204.

Figure 2B:
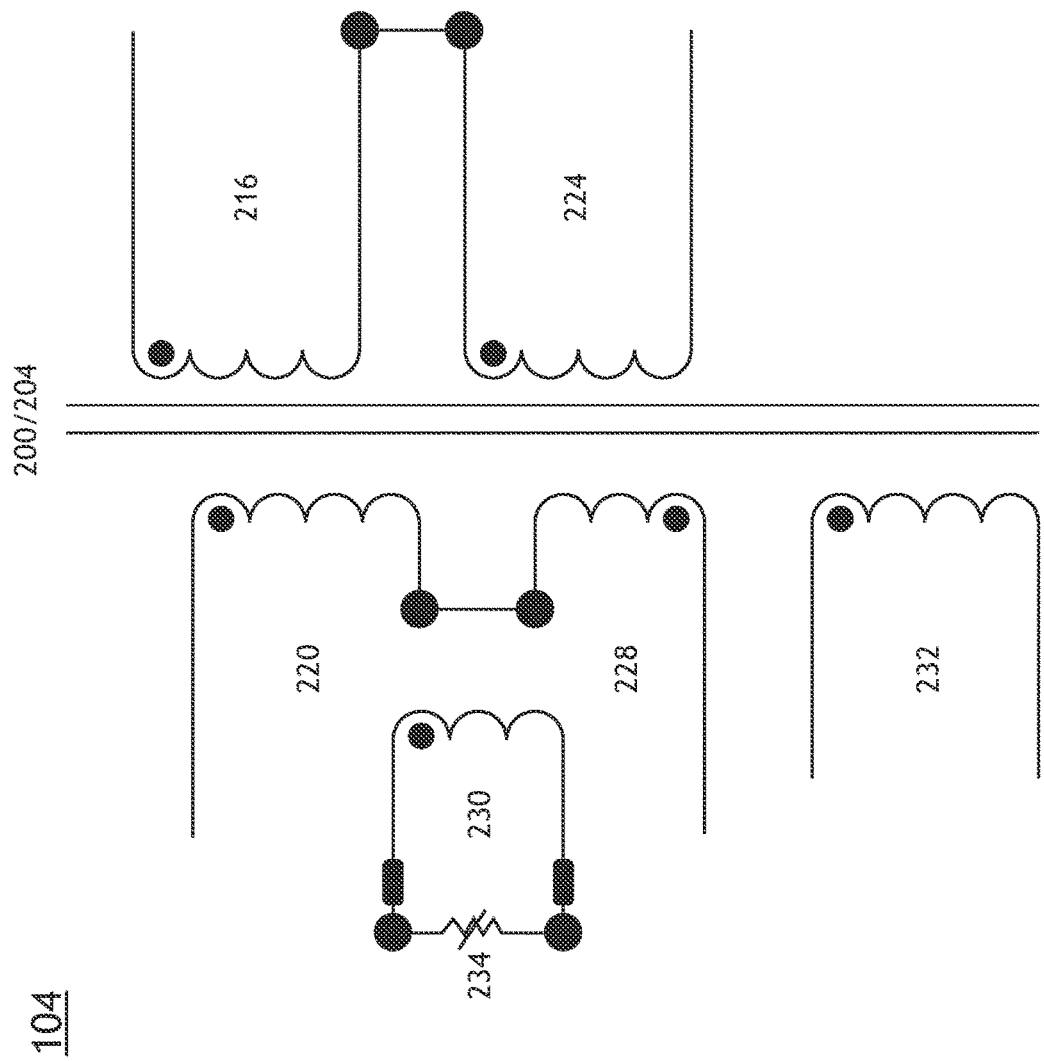
FIG. 2B depicts a schematic drawing of a residual current sensor in accordance with an embodiment of the present disclosure.

Referring to FIG. 2B, a schematic drawing of the residual current sensor 104, in accordance with one or more embodiments of the disclosure, is shown. In embodiments, the DC null winding 230 may further include a variable resistor 234 coupled to termini of the DC null winding 230. The polarity mark of each winding is indicated as a round dot.

Referring once again to FIG. 2A, the first core element 208 and the second core element 212 may be each configured as any type of core element configured with any type of core element material. For example, the first core element 208 and the second core element 212 may be configured as toroidal cores with multiple windings. In regard to toroid core elements, the first core element 208 and the second core element 212 may be configured with any shape of toroid core element including but not limited to a circular toroid, an oblong toroid, and obround core element, a square toroid, a rectangular toroid, a triangular toroid, or any surface of revolution configured with a hole in the middle, wherein the axis of revolution passes through the hole and so does not intersect the surface. For example, the first core element 208 may comprise a core block configured as a circular toroid.

The first core element 208 and the second core element 212 may be constructed of any material including but not limited to solid iron, carbonyl iron, amorphous steel, silicon steel, amorphous metals, ferrite ceramics, laminated magnetic core elements, and nanocrystalline metal. For example, the first core element 208 and the second core element 212 may include a nanocrystalline alloy. For instance, the first core element 208 and/or the second core element 212 may be formed from a nanocrystalline ribbon, such as 1K107 nanocrystalline alloy strips.

The first excitation coil winding 216 and/or the second excitation coil winding 224 may be configured with any number of turns or ranges of turns. For example, the first excitation coil winding 216 and/or the second excitation coil winding 224 may include turns in a range of 100 to 2000 turns. In another example, the first excitation coil winding 216 and/or the second excitation coil winding 224 may include turns in a range of 250 to 1000 turns. In another example, the first excitation coil winding 216 and/or the second excitation coil winding 224 may include approximately 500 turns.

The first secondary coil winding 220 and the second secondary coil winding 228 may be configured with any number of turns or ranges of turns. For example, the first secondary coil winding 220 and/or the second secondary coil winding 228 may include turns in a range of 10 to 200 turns. In another example, the first secondary coil winding 220 and/or the second secondary coil winding 228 may include turns in a range of 20 to 100 turns. In another example, the first secondary coil winding 220 and/or the second secondary coil winding 228 may include approximately 40 turns.

The DC null winding 230 may be configured with any number of turns or ranges of turns. For example, the DC null winding 230 may include turns in the range of 1 to 10 turns. In another example, the DC null winding 230 may include turns in the range of 2 to 5 turns. In another example, the DC null winding 230 may include approximately 3 turns.

The residual current sensor 104 may be configured with any dimensions. For example, the residual current sensor 104 may be configured as a compact form, enabling the system 100 to fit within small form factors. For example, the first core 200 and the second core 204 may be configured with outer diameters of approximately 31 mm and interior diameters (e.g., providing space for wires or conductors to be inserted through) of approximately 15 mm.

In embodiments, the system 100, including the residual current sensor 104, may be configured to operate in compliance with national and international standards. For example, the residual current sensor 104 may be configured to operate in compliance with IEC 60755:2017 standards entitled "General safety requirements for residual current operated protective devices" authorized by the International Electrical Commission (IEC). For example, the system 100 may be configured to operate with a rated operating current of 0 to 100 mA AC/DC. In another example, the system 100 may be configured to operate with a resolution of approximately 0.1 mA. In another example, the system 100 may be configured with a measurement range of +/−0.3 A. In another example, the system 100 may be configured to operate with a response time equal or less than 250 ms. In another example, the system 100 may be configured to operate with a response time equal to or less than 25 ms.

Referring to FIG. 3, a block diagram illustrating the system 100 with multiple conductors inserted through the hole or aperture of the first core element 208 and the second core element 212 of the residual current sensor 104, in accordance with one or more embodiments of the disclosure is shown. Any number or type of conductors may be inserted through the residual current sensor 104. For example, an AC input wire 238 and corresponding (e.g., electrically coupled) AC output wire 242 may be inserted through the first core element 208 and the second core element 212. In another example, a DC input wire 246 and a corresponding (e.g., electrically coupled) DC output wire 250 may be inserted through the first core element 208 and the second core element 212. In some embodiments, the AC/DC input wire and corresponding AC/DC output wire may be inserted through the first core element 208 and the second core element 212. The self-test wire 232 is also shown inserted through the first core element 208 and the second core element 212. Any configurations of input and output wires may be used. For example, the system 100 may be configured to measure current from three AC input and output wires, each AC input wire carrying a different phase of current. The conductors inserted through residual current sensor 104 may also be configured to carry mixed (AC and DC) currents. It is contemplated that the current flows through the phases, through the load, and returns through the neutral, or any of the other phases.

Figure 4:
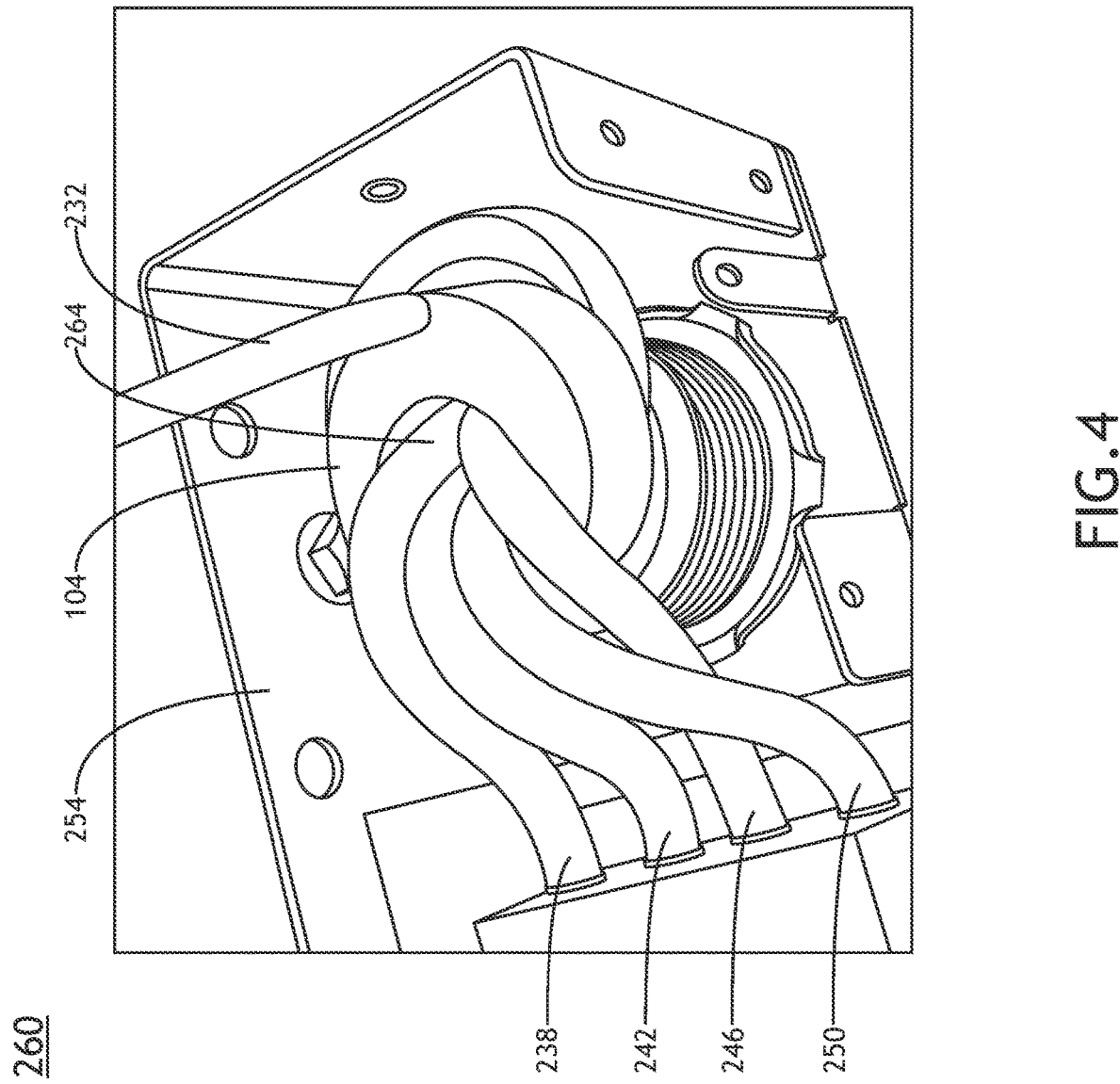
FIG. 4 depicts a residual current sensor incorporated into the housing of an electronic device in accordance with an embodiment of the present disclosure.

Referring to FIG. 4, a diagram illustrating the residual current sensor 104 incorporated into the housing 254 of an electronic device 260, in accordance with one or more embodiments of the disclosure is shown. The electronic device 260 includes the AC input wire 238 and the corresponding AC output wire 242 inserted through the aperture 264, The electronic device 260 may also include the DC input wire 246 and the corresponding output DC output wire 250. The self-test wire 232 is shown incorporated into the packaging (e.g., wrapping tape) of the residual current sensor 104.

Figure 5:
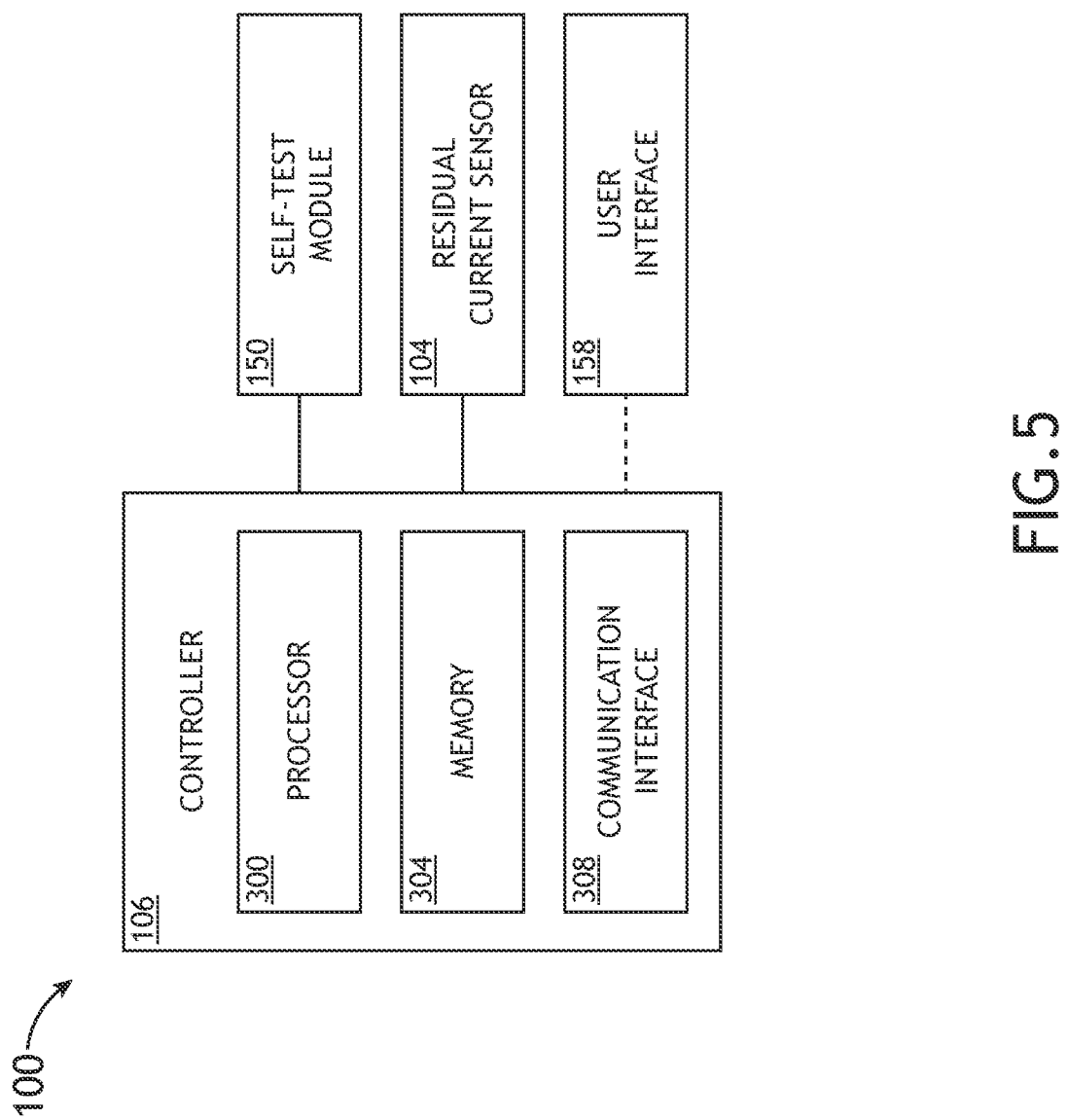
FIG. 5 depicts a block diagram of the system including components of the controller in accordance with an embodiment of the present disclosure.

Referring to FIG. 5, a block diagram of the system including components of the controller in accordance with an embodiment of the present disclosure is shown. The controller 106 may be configured as any type of processor-containing device capable of facilitating one or more functions of the system. For example, the controller 106 may be configured as a microcontroller (MCU). For instance, the controller 106 may be configured as a MCU configured with ARM architecture (e.g., a high-performance ARM-based MCU). The controller 106 may be configured to synchronously capture time series data samples into memory buffers via DMA-controlled phase-locked loop (PLL) and/or the aforementioned ADC 128. For example, the controller 106 may be configured to process signals via ADC every −0.3° phase angle. For instance, the controller 106 may be configured to process 1024 samples per line cycles at 50/60 Hz. In embodiments, the controller 106 includes one or more processors 300, a memory 304, and a communication interface 308.

The one or more processors 300 may include any processor 300 or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 300 may also include any device configured to execute algorithms and/or instructions (e.g., program instructions stored in memory 304). In one embodiment, the one or more processors 300 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration.

The memory 304 can be an example of a tangible, computer-readable storage medium that provides functionality to store various data and/or program code associated with operation of the controller 106 and/or other components of the system 100, such as firmware, firmware updates, software programs and/or code segments, or other data to instruct the controller 106 and/or other components to perform the functionality described herein. Thus, the memory 304 can store data, such as a program of instructions for operating the system 100 or other components. It should be noted that while a single memory 304 is described, a wide variety of types and combinations of memory 304 (e.g., tangible, non-transitory memory) can be employed. The memory 304 can be integral with the controller, can comprise stand-alone memory, or can be a combination of both. Some examples of the memory 304 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth. The memory 304 may also be configured to include data transfer or processing functions via DMA. For example, as mentioned herein, the memory 304 may be able to facilitate ADC and DAC functions of the system 100 via DMA.

The communication interface 308 can be operatively configured to communicate with components of the controller 106 and other components. For example, the communication interface 308 can be configured to retrieve data from the controller 106 or other components of the system 100, transmit data for storage in the memory 304, retrieve data from storage in the memory 304, and so forth. The communication interface 308 can also be communicatively coupled with controller 106 and/or system elements to facilitate data transfer between system components.

Figure 6:
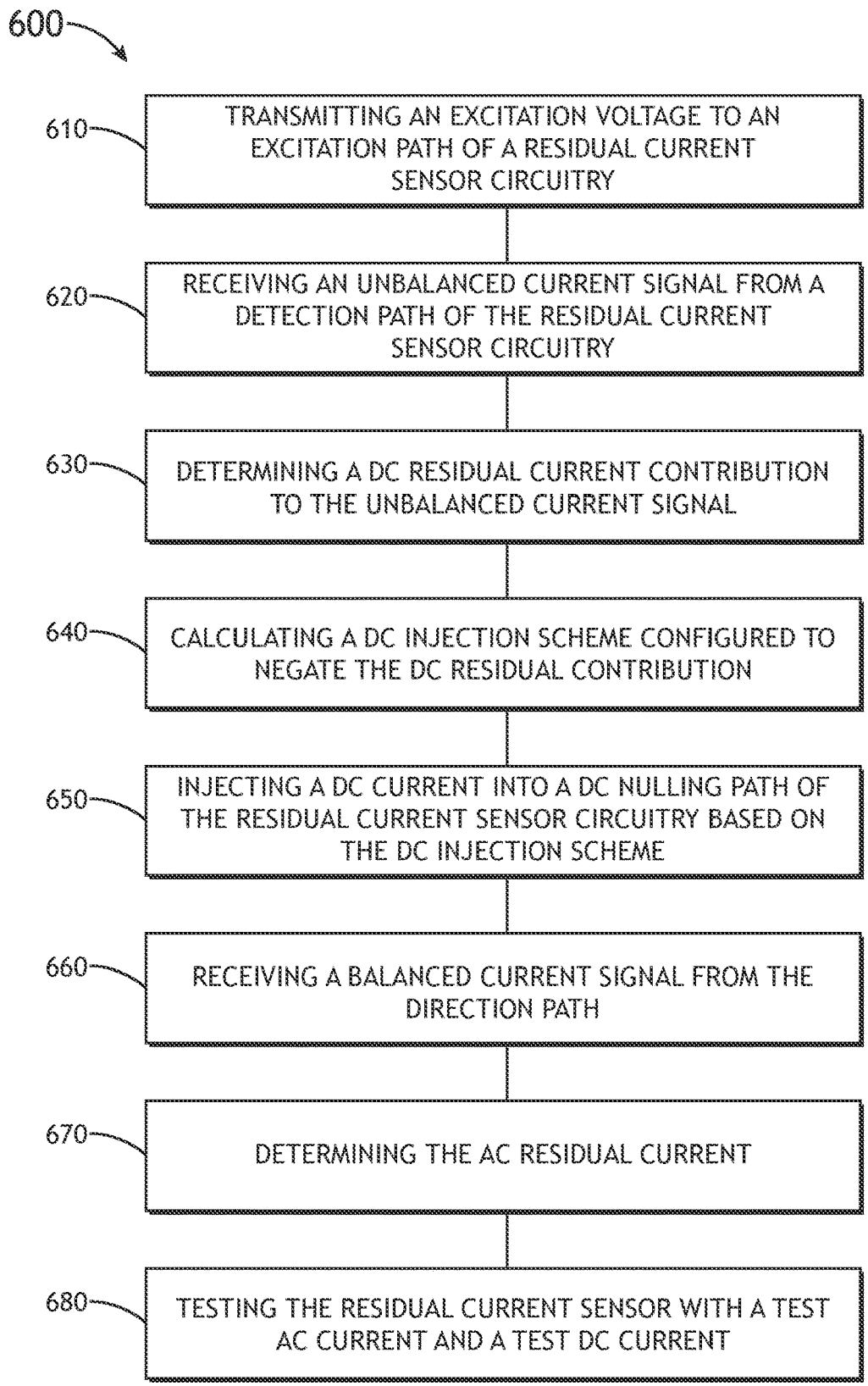
FIG. 6 depicts a flow diagram illustrating a method for determining the residual current for both AC currents and DC currents in accordance with an embodiment of the present disclosure.

Referring to FIG. 6, a flow diagram illustrating a method 600 for determining the residual current for both AC and DC currents in accordance with an embodiment of the present disclosure is shown. The method 600 may be executed and used by the system 100 to discern the AC residual current and DC residual current from separate AC and DC lines running through the residual current sensor 104, or a single line running both AC and DC currents.

In embodiments, the method 600 includes a step 610 of transmitting an excitation voltage to the excitation path 114 of the residual current sensor circuitry (e.g., to the residual current sensor 104). For example, the controller 106 may be configured to send via the AC excitation voltage source 118, a sinusoidal current into the first core 200 and the second core 204. For instance, the sinusoidal circuit may be configured as an approximately 2 kHz sinusoidal waveform.

In embodiments, the method 600 further includes a step 620 of receiving an unbalanced current signal from the detection path 126 of the residual sensor circuitry. If a DC current is being tested within the residual current sensor 104, then the polarity of the residual DC will cause the first core 200 and/or the second core 204 to asymmetrically saturate. When the flux density of the first core 200 and/or the second core 204 is at a maximum value, current ceases to flow through the first core 200 and/or the second core 204, resulting in a $2^{nd}$ order harmonic distortion at the current waveform zero-crossings. The unbalanced current signal is then received by the controller 106 for processing.

In embodiments, the method 600 further includes a step 630 of determining a DC residual current contribution to the unbalanced current signal. For example, the unbalanced current signal may first undergo conversion by the ADC 128. In some embodiments, a feedback comb filter may be implemented to detect/reject harmonic disturbances through constructive or destructive interference. In some embodiments, a cascaded integrator-comb filter (CIC) may be implemented. For example, the CIC may perform sample decimation via an integer coefficient multiplication resulting in an anti-aliasing low-pass response (e.g., −3 dB @ 1 kHz). The sample decimation may match the size of the branch circuit load current time series for a Pearsons Correlation Coefficient (PCC). For example, the system 100 may utilize PCC to facilitate the comparison of one or more instantaneous residual current samples time series to each of the branch circuit current samples time series. For instance, a positive linear correlation close to "+1" between the instantaneous residual current samples time series and the branch circuit current samples times series would indicate a high probability of a match or identification of a current leakage path.

In some embodiments, the method 600 further includes a step 640 of calculating a DC injection scheme configured to negate the DC residual contribution. The first steps toward calculating a DC injection scheme may first be realized through the action of the feedback comb filter and/or the CIC. The step 640 is further advanced through the action of a proportional-integral-derivative (PID) controller (e.g., disposed within the controller 106). For example, system algorithms may drive a PID controller loop every $\frac{1}{32}^{nd}$ of a line cycle to cancel the DC residual current by varying a programmable current source (e.g., the AC excitation voltage source 118) that would inject an offsetting, opposite polarity DC through the DC null winding 230 to minimize a root mean square (RMS) measurement error and eliminate the $2^{nd}$ order harmonic and restore the fundamental frequency.

The PID controller is configured to contribute to restoration of the sinusoidal with minimal overshoot and rapid setting times of approximately 10 ms or less. The PID may operate high-priority interrupt service routine (ISR) loops (e.g., updated at ~3.8 kHz). The PID is configured to manage both the integral windup and/or saturation of the first core element 208 and second core element 212 and also manages current source polarity inversion.

In some embodiments, the method 600 further includes a step 650 of injecting a DC current into a DC nulling path of the residual current sensor circuitry based on the DC injection scheme. For example, the AC excitation voltage source 118 may inject the DC nulling current into the DC nulling path 138, where upon reaching the DC null winding, the DC residual current is reduced, eventually producing a balanced current signal (e.g., a sinusoidal current signal). Accordingly, the DC residual current is equal to the amount of injected DC current required to restore the resultant current waveform (across a burden resistor) caused by the AC excitation voltage source 118 back to a balanced or sinusoidal waveform at the fundamental frequency (e.g., approximately 2 kHz). In this manner, the system 100 is capable of measuring residual DC to as low as nearly 0 mA.

Figure 7:
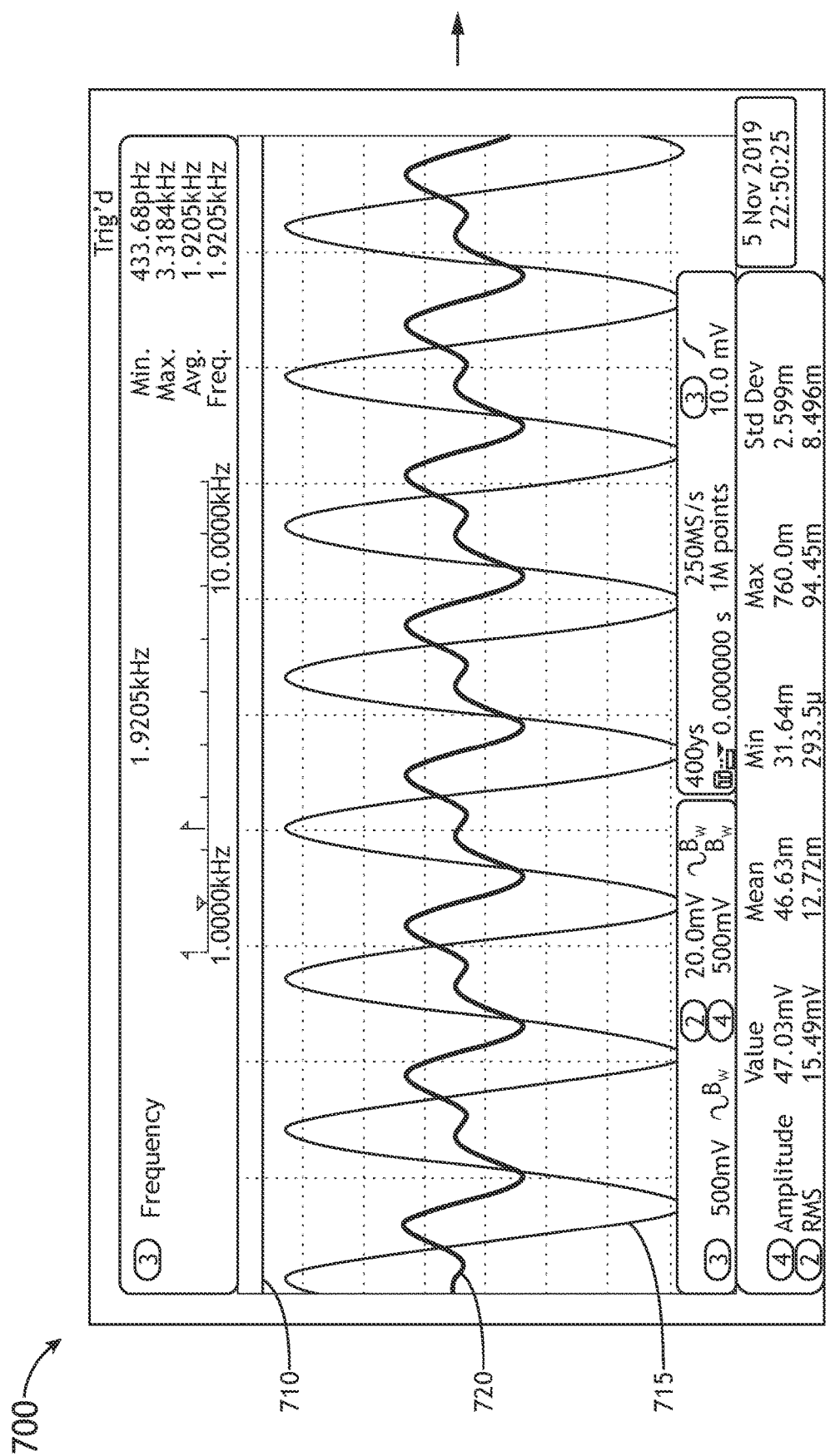
FIG. 7 depicts a before-nulling screenshot and an after-nulling screenshot of an oscilloscope display presenting a system-measured DC current, an excitation voltage waveform, and an AC residual current waveform in accordance with an embodiment of the present disclosure.
Figure 7:
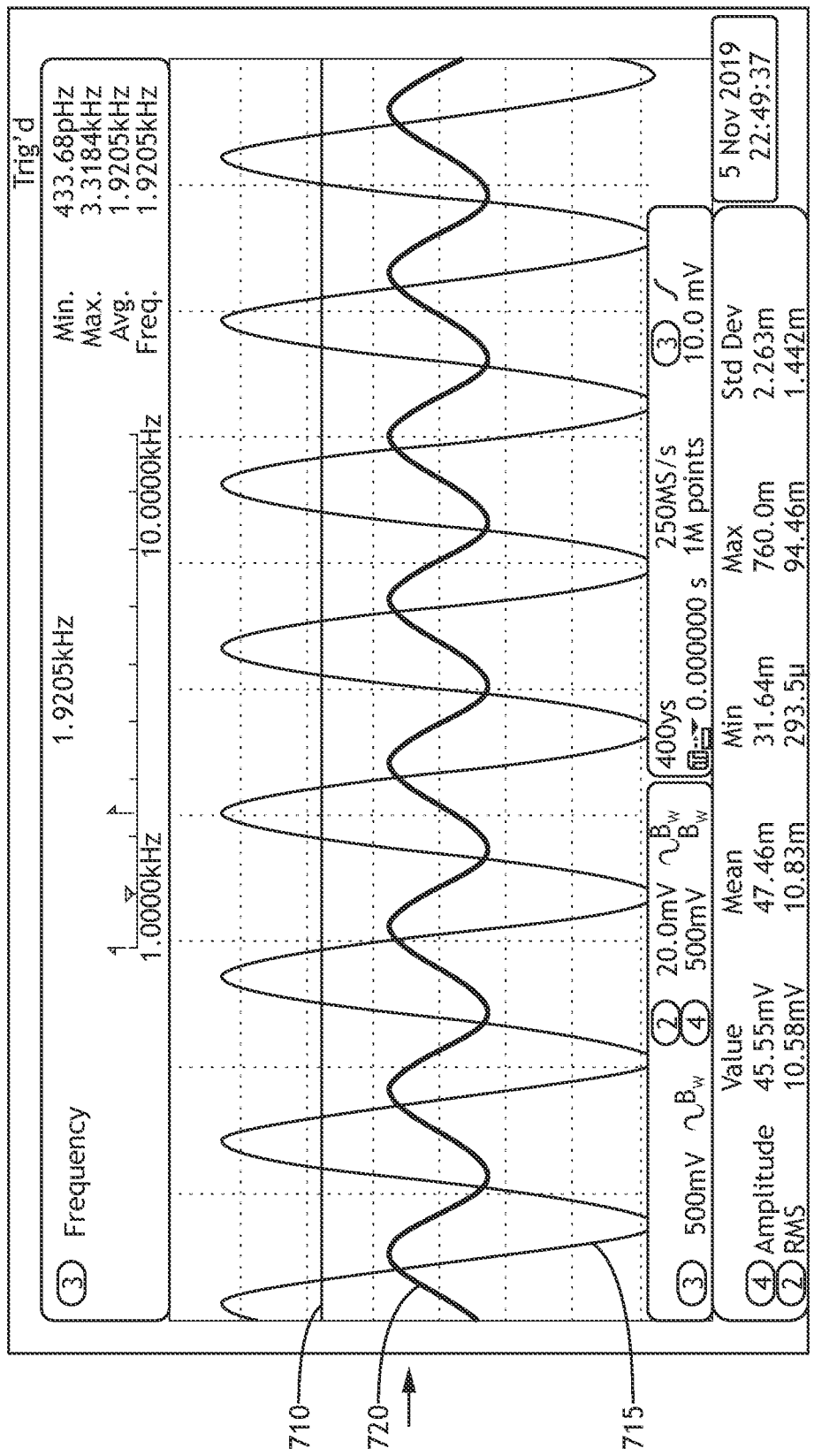

Referring to FIG. 7, a before-nulling screenshot 700 and an after-nulling screenshot 705 of an oscilloscope display presenting a system-measured DC current 710, an excitation voltage waveform 715, and an AC residual current waveform 720 is shown. In the before-nulling screenshot 700, the AC residual current waveform 720 is altered from a sinusoidal waveform (as originally inputted as the excitation voltage waveform 715) to a $2^{nd}$ order harmonic waveform due to the presence of high DC residual current within the DC current 710. Canceling of the DC residual current reduces the overall DC current 710, and returns the AC residual current waveform to the sinusoidal form.

Referring once again to FIG. 6, in some embodiments, the method 600 further includes a step 660 of receiving a balanced current signal from the detection path 126. As in step 620, the unbalanced current signal is received by the controller 106 for processing.

In some embodiments, the method 600 further includes a step 670 of determining the AC residual current. Once the effects of the DC residual current are negated, and a balanced, sinusoidal signal is maintained at the 2 kHz frequency, then any AC residual current up to 2 kHz can be accurately measured using a standard method of transducing the voltage across a burden resistor. The controller 106 includes a phase-locked loop (PLL) configured to fix the sampling intervals to the line frequency. This results in a high-frequency excitation AC voltage characteristic waveform that is captured at the point of manufacture, which can then be subtracted at runtime, facilitating the measurement of AC to as low as nearly zero milliamps.

The method 600 may further include multiple algorithmic and/or algorithmic-based schemes for detecting AC residual current and DC residual current. For example, the system 100 may utilize a normalized Root Mean Square (RMS) error proportional term configured to minimize normalized RMS error as compared to a reference RMS value (e.g., a reference RMS value determined during manufacturing). In another example, the system 100 may utilize Time-Domain Wave Subtraction (TDWS) to remove induced excitation voltage waveforms under zero AC/DC residual fault conditions (e.g., as determined during manufacturing).

In some embodiments, the method 600 further includes a step 680 of testing the residual current sensor (e.g., performing a self-test) with a test AC current and a test DC current. The self-test is performed by the self-test module 150 via the self-test wire 232 that passes through the residual current sensor 104.

The self-test module 150 initiates the self-test by executing a self-test voltage waveform that is used to generate a self-test current through the self-test wire 232. The self-test current typically includes a DC component and an AC component. The self-test current may also include only a DC component or only an AC component. The self-test current may be configured as having any frequency. For example, the self-test current may have a frequency of approximately 2 kHz. For instance, the self-test current may have a frequency of 1.95 kHz.

Figure 8:
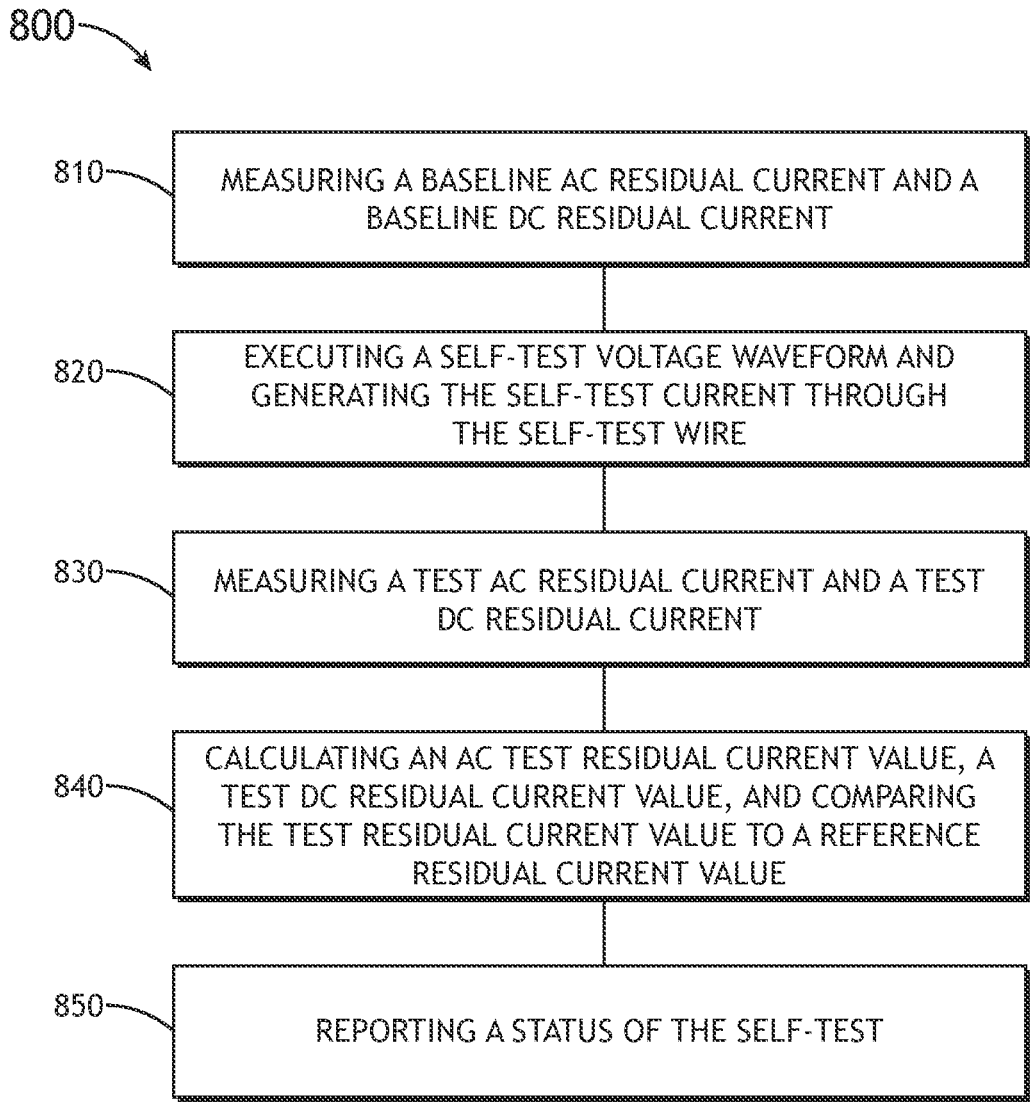
FIG. 8 depicts a flow diagram of a method for performing a self-test on the system for measuring AC residual current and DC residual current in accordance with an embodiment of the present disclosure.

Referring to FIG. 8, a flow diagram of a method 800 for performing a self-test on the system 100 in accordance with an embodiment of the present disclosure is shown. In some embodiments, the method 800 includes a step 810 of measuring a baseline AC residual current and a baseline DC residual current. The baseline AC residual current and the baseline DC residual current are determined before a self-test current is passed through the system 100.

In some embodiments, the method 800 includes a step 820 of executing a self-test voltage waveform and generating the self-test current through the self-test wire 232. The self-test current generated from the executed self-test voltage waveform may include both a DC component and an AC component. The self-test current may also include only a DC component or only an AC component. The self-test current may be configured as having any frequency. For example, the self-test current may have a frequency of approximately 2 kHz. For instance, the self-test current may have a frequency of 1.95 kHz.

In some embodiments, the method 800 includes a step 830 of measuring a test AC residual current and a test DC residual current. For example, the test AC residual current and the test DC residual current are measured when the self-test current is generated through the self-test wire 232. For instance, the test AC residual current and the DC residual current may be calculated via steps 610 through 670 of the method 600 as shown in FIG. 6.

In some embodiments, the method 800 includes a step 840 of calculating an AC test residual current value and a test DC residual current value and comparing the test residual current value to a reference residual current value. Once the test AC residual current and the test DC residual current are measured and quantified, differences in values between the test AC residual current/test DC residual current and the baseline AC residual current/baseline DC residual current are calculated, and the test AC residual current values and the test DC residual current values are adjusted based on those differences. The adjusted values are compared to the reference AC residual current values and the reference DC residual current.

In some embodiments, the method includes a step 850 of reporting a status of the self-test. For example, the adjusted test AC residual current and the adjusted DC residual current matches the reference AC residual current values and the reference DC residual current (e.g., within a tolerance), the self-test passes, and a "pass" response is indicated via the user interface 158. In another example, if the adjusted test AC residual current and the adjusted DC residual current does not match the reference AC residual current values and the reference DC residual current, the self-test fails, and a "fail" response is indicated via the user interface 158.

It is contemplated that the reference residual current value may be set to fit a particular application. The reference residual current value may be set to fit a desired range, such as +/−1 mA threshold band. It is further contemplated that it may be desired to provide a self-test current that is set to a low current value, such as 4 mA to 10 mA. Therefore, in one embodiment, the self-test current may be set at 7 mA and the reference residual current value may be 5-9 mA in order to accommodate a +/−1 mA accuracy specification. It should be understood that the self-test current and the reference residual current value may be adjusted to serve other types of applications without departing from the scope and intent of the present disclosure.

The self-test may be administered at any time period or condition (e.g., as a factory-setting). For example, the self-test may be administered when the system 100, or device comprising the system 100, is powered up. The self-test may also be performed at any minute, hourly, daily, monthly, or yearly increments. In some embodiments, the self-test is readministered if a "fail" response is indicated. For example, the self-test may be readministered once, twice, ten times, 100 times, 1000 times, or continuously until a "pass" response is indicated, or the system 100, or the device comprising the system 100, is shut down. By readministering a failed self-test, the system 100, or the device comprising the system 100, will avoid reporting failed self-tests that are false-positives or are merely transient. The intervals at which the self-test is performed may be determined via firmware (e.g., fixed and not user configurable), via software, or via user input. In some embodiments, one or more settings of the self-test module are not modifiable by a user (e.g., the factory-setting is a permanent setting).

Aspects of the self-test may be determined during factory calibration of the system 100 and system 100 components. For example, a factory calibration of the system may be performed that includes the measuring and recording of the intrinsic response of the residual current sensor 104 to the excitation current voltage. This factory calibration may be performed with no AC or DC leakage current present. In this manner, by subtracting the adjusted test AC residual current/test DC residual current from the baseline AC residual current/baseline DC residual current, AC residual current may be determined to as low as nearly 0 mA.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be implemented, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those having skill in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. A system, comprising:
 a residual current sensor circuitry comprising a residual current sensor configured to measure residual current from a source of AC power;
 a controller electrically coupled to the residual current sensor circuitry comprising:
  one or more processors; and
  a memory configured to store data and instructions executable by the one or more processors, where the instructions include:
   transmitting an excitation voltage to an excitation path of the residual current sensor circuitry;
   receiving an unbalanced current signal from a detection path of the residual current sensor circuitry;
   determining a DC residual current contribution to the unbalanced current signal;

calculating a DC injection scheme configured to negate the DC residual contribution;

injecting a DC current into a DC nulling path of the residual current sensor circuitry based on the DC injection scheme;

receiving a balanced current signal from the detected path; and determining an AC residual current; and a testing module configured to send a test AC current and a test DC current through the residual current sensor.

2. The system of claim 1, wherein the unbalanced current signal comprises a $2^{nd}$ order harmonic distortion at a current waveform zero-crossing.

3. The system of claim 2, wherein the balanced current signal is characterized as sinusoidal at fundamental frequency.

4. The system of claim 3, wherein the controller further comprises a proportional-integral-derivative controller configured to calculate the DC injection scheme.

5. The system of claim 1, wherein the residual current sensor comprises:
a first core comprising:
a first excitation coil winding; and
a first secondary coil winding;
a second core comprising:
a second excitation coil winding; and
a second secondary coil winding; and
a DC null winding configured to wind through both the first core and the second core.

6. The system of claim 1, wherein the testing module is configured to send a test AC
current and a test DC current through the residual current sensor according to a periodic schedule or upon user input.

7. The system of claim 1, wherein the testing module is configured to provide an alert when a fault is detected.

8. The system of claim 7, wherein the testing module repeats delivery of the test AC current and the test DC current through the residual current sensor until the fault is no longer detected.

9. A system, comprising:
a residual current sensor configured to sense a residual current from a source of AC power, comprising:
a first core comprising:
a first excitation coil winding; and
a first secondary coil winding;
a second core comprising:
a second excitation coil winding; and
a second secondary coil winding; and
a DC null winding configured to wind through both the first core and the second core;
a residual current sensor circuitry electrically coupled to the residual current sensor comprising a controller electrically coupled to the residual current sensor circuitry, the controller comprising:
one or more processors; and
a memory configured to store data and instructions executable by the one or more processors, wherein the instructions include:
transmitting an excitation voltage to an excitation path of the residual current sensor circuitry;
receiving an unbalanced current signal from a detection path of the residual current sensor circuitry;
determining a DC residual current contribution to the unbalanced current;
calculating a DC injection scheme configured to negate the DC residual contribution;
injecting a DC current into a DC nulling path of the residual current sensor circuitry based on the DC injection scheme;
receiving a balanced current signal from the detection path; and
determining an AC residual current.

10. The system of claim 9, further comprising:
a testing module configured to send a test AC current and a test DC current through the residual current sensor.

11. The system of claim 9, wherein the unbalanced current signal comprises a $2^{nd}$ order harmonic distortion at a current waveform zero-crossing.

12. The system of claim 11, wherein the balanced current signal is characterized as sinusoidal at fundamental frequency.

13. The system of claim 9, wherein the controller further comprises a proportional-integral-derivative controller configured to calculate the DC injection scheme.

14. The system of claim 10, wherein the testing module is configured to send a test AC current and a test DC current through the residual current sensor according to a periodic schedule or upon user input.

15. The system of claim 10, wherein the testing module is configured to provide an alert when a fault is detected.

16. The system of claim 15, wherein the testing module repeats delivery of the test AC current and the test DC current through the residual current sensor until the fault is no longer detected.

17. A method, comprising:
transmitting an excitation voltage to an excitation path of a residual current sensor circuitry;
receiving an unbalanced current signal from a detection path of the residual current sensor circuitry;
determining a DC residual current contribution to the unbalanced current signal;
calculating a DC injection scheme configured to negate the DC residual contribution;
injecting a DC current into a DC nulling path of the residual current sensor circuitry based on the DC injection scheme;
receiving a balanced current signal from the detection path; and
determining an AC residual current.

18. The method of claim 17, further comprising testing the residual current sensor with a test AC current and a test DC current.

19. The method of claim 18, wherein testing the residual current sensor with the test AC current and the test DC current comprises:
measuring a baseline AC residual current and a baseline DC residual current;
executing a self-test voltage waveform and generating the self-test current through a self-test wire;
measuring a test AC residual current and a test DC residual current;
calculating an AC test residual current value, a test DC residual current value, and comparing the test residual current value to a reference residual current value; and
reporting a status of the self-test.

* * * * *